( 12 ) United States Patent
Cheng et al.

(10) Patent No.: US 8,350,612 B2
(45) Date of Patent: Jan. 8, 2013

(54) CIRCUIT FOR RESETTING SYSTEM AND DELAY CIRCUIT

(75) Inventors: Zen-Wen Cheng, Tainan County (TW); Kai-Lan Chuang, Tainan County (TW); Ching-Chung Lee, Tainan County (TW)

(73) Assignee: Himax Technologies Limited, Tainan (TW)

( * ) Notice: Subject to any disclaimer, the term of this patent is extended or adjusted under 35 U.S.C. 154(b) by 127 days.

(21) Appl. No.: 12/609,381

(22) Filed: Oct. 30, 2009

(65) Prior Publication Data

US 2011/0102037 A1    May 5, 2011

(51) Int. Cl.
 *H03H 11/26* (2006.01)
(52) U.S. Cl. ......... 327/264; 327/261; 327/262; 327/263
(58) Field of Classification Search .......... 327/108–112, 327/142, 143, 198, 261–264, 269, 270, 276–278, 327/379, 389, 391; 326/22–27, 81–87
See application file for complete search history.

(56) References Cited

U.S. PATENT DOCUMENTS

| | | | | |
|---|---|---|---|---|
| 5,175,445 A | * | 12/1992 | Kinugasa et al. | 326/87 |
| 5,220,205 A | * | 6/1993 | Shigehara et al. | 327/198 |
| 6,140,835 A | * | 10/2000 | Shirai | 326/24 |
| 7,821,293 B2 | * | 10/2010 | Fazzi et al. | 326/34 |
| 2004/0135606 A1 | * | 7/2004 | Takahashi et al. | 327/170 |
| 2007/0018696 A1 | * | 1/2007 | Lim | 327/112 |
| 2007/0069768 A1 | * | 3/2007 | Hatooka et al. | 327/74 |
| 2007/0183246 A1 | * | 8/2007 | Byeon | 365/226 |
| 2008/0204101 A1 | * | 8/2008 | Kawashima et al. | 327/206 |
| 2009/0153214 A1 | * | 6/2009 | Takatori | 327/262 |
| 2009/0309642 A1 | * | 12/2009 | Kim | 327/261 |

* cited by examiner

*Primary Examiner* — Lincoln Donovan
*Assistant Examiner* — Brandon S Cole
(74) *Attorney, Agent, or Firm* — J.C. Patents

(57) ABSTRACT

A reset circuit and a delay circuit are provided. The delay circuit includes a first resistor module, a second resistor module, a switch module and a capacitor module. First terminals of the first and the second resistor modules are coupled respectively to a first voltage and a second voltage. The switch module have a control terminal served as a input terminal of the delay circuit, a first terminal served as a output terminal of the delay circuit, a second terminal coupled to a second terminal of the first resistor module, and a third terminal coupled to a second terminal of the second resistor module. In the delay circuit, the first terminal selectively connected to the second terminal or the third terminal in accordance with the control terminal. The capacitor module couples between the first terminal of the switch module and the second voltage.

16 Claims, 9 Drawing Sheets

CIRCUIT FOR RESETTING SYSTEM AND DELAY CIRCUIT

BACKGROUND OF THE INVENTION

1. Field of the Invention

The present invention relates to a delay circuit, and more particularly, to a reset circuit with the delay circuit to prevent a system reset due to a noise.

2. Description of Related Art

A liquid crystal display (LCD) includes a display panel and at least a source driver. The source driver outputs display voltages to the display panel in accordance with received video signals. The display panel includes a plurality of pixels for display images, and each one of the pixels has a storage capacitor. The storage capacitors of all pixels are respectively charged in response to the display voltages for displaying colors.

The source driver may malfunction while the operating voltage is not stable yet, for example during turning on or off of the LCD. Therefore a reset circuit is required to ensure the functionality of the source driver.

For another example, the reset operation can be used when turning off the LCD for the storage capacitors of all pixels being discharged to prevent afterimages. The afterimages would influence the visional effect of the LCD, or reduce the reliability of the pixels. The conventional method for eliminating the afterimages is to detect variation of the operating voltage of the LCD. The operating voltage is decreased gradually at power off. When the operating voltage is lower than a threshold voltage, it is determined that the LCD is power off, and then a reset operation is proceeded. For example, by conducting the data lines and scan lines coupled to the pixels, both two terminals of each the storage capacitors are electrically connected to a common voltage so as to have the equivalent potential, and the afterimages are eliminated.

Sometimes a noise would be generated by the power source or other devices of the LCD. In the period of detecting the variation of the operating voltage, the noise would cause the foregoing method a false reset action.

SUMMARY OF THE INVENTION

The present invention provides a reset circuit and a delay circuit thereof to prevent a system reset due to a noise.

The present invention provides a reset circuit. The reset circuit includes a power detector module and a pulse-width determination module. The power detector module detects whether a voltage of a power source is lower than a threshold voltage, and correspondingly outputs a first reset signal. The pulse-width determination module coupled to the power detector module determines whether a pulse-width of the first reset signal is long enough, and correspondingly outputs a second reset signal to reset a system. The pulse-width determination module comprises a delay circuit and a logic circuit. The delay circuit delaying the first reset signal for the threshold time to output a delayed reset signal. The logic circuit couples to the delay circuit and the power detector module, and processes a logical AND operation with the first reset signal and the delayed reset signal for outputting the second reset signal. The delay circuit comprises a first resistor module, a second resistor module, a switch module and a capacitor module. The first resistor module provides a first resistance, wherein a first terminal of the first resistor module is coupled to a first voltage. The second resistor module provides a second resistance, wherein a first terminal of the second resistor module is coupled to a second voltage. The switch module have a control terminal coupled to the power detector module, a first terminal coupled to the logic circuit, a second terminal coupled to a second terminal of the first resistor module, and a third terminal coupled to a second terminal of the second resistor module, wherein the first terminal thereof selectively connected to the second terminal or the third terminal thereof in accordance with the control terminal thereof. The capacitor module couples between the first terminal of the switch module and the second voltage.

The present invention provides a delay circuit comprising a first resistor module, a second resistor module, a switch module and a capacitor module. The first resistor module provides a first resistance, wherein a first terminal of the first resistor module is coupled to a first voltage. The second resistor module provides a second resistance, wherein a first terminal of the second resistor module is coupled to a second voltage. The switch module have a control terminal served as a input terminal of the delay circuit, a first terminal served as a output terminal of the delay circuit, a second terminal coupled to a second terminal of the first resistor module, and a third terminal coupled to a second terminal of the second resistor module, wherein the first terminal thereof selectively connected to the second terminal or the third terminal thereof in accordance with the control terminal thereof. The capacitor module couples between the first terminal of the switch module and the second voltage.

When the pulse-width of the first reset signal is not greater than the threshold time, the pulse-width determination module determines that the output voltage of the power source encounters a noise. When the pulse-width of the first reset signal is greater than the threshold time, the pulse-width determination module outputs the second reset signal to a system. Therefore, the system reset due to the noise could be prevented.

In order to make the features and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
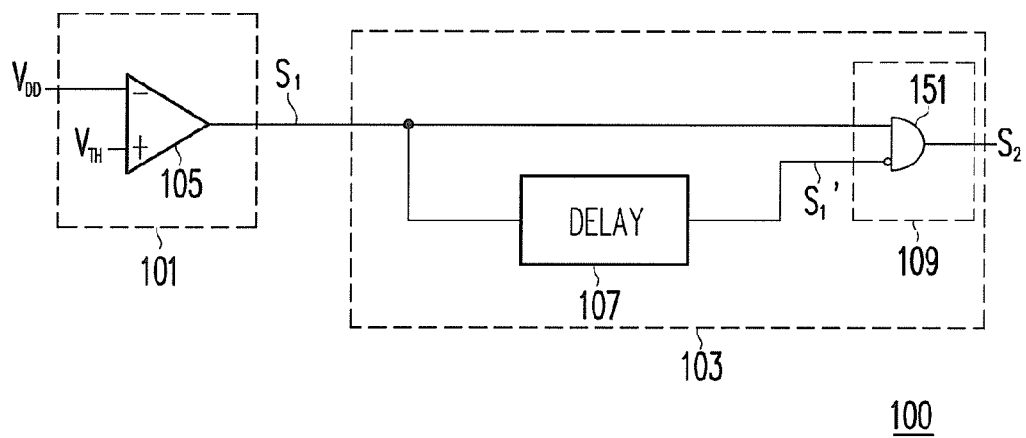
FIG. 1 is a functional block diagram of a reset circuit according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 shows a functional diagram of a reset circuit 100 according to an embodiment of the present invention. Referring to FIG. 1, the reset circuit 100 includes a power detector module 101 and a pulse-width determination module 103. The reset circuit 100 is adapted to a system powered by a power source, and the power detector module 101 detects the variance of the voltage $V_{DD}$ of the power source. In the embodiment of the present invention, the power detector module 101 includes a voltage comparator 105, such as an operational amplifier. The non-inverting input terminal marked "+" is coupled to the threshold voltage $V_{TH}$. The inverting input terminal marked "−" of the voltage comparator 105 is coupled to detect the voltage $V_{DD}$ of the power source. When the voltage $V_{DD}$ of the power source is lower than the threshold voltage $V_{TH}$, it is determined that the system goes into a reset status. At this point, the power detector module 101 correspondingly outputs a first reset signal $S_1$. It should be noted that the present invention is not limited thereto. People skilled in the art may implement the power detector module 101 in any way, e.g. utilizing a dedicated voltage comparator chips LM339 produced by National Semiconductor.

The pulse-width determination module 103 is coupled to the power detector module 101 for receiving the first reset signal $S_1$. The pulse-width determination module 103 determines whether the pulse-width of the first reset signal $S_1$ is greater than a threshold time. In the embodiment, the pulse-width determination 103 includes a delay circuit (DELAY) 107 and a logic circuit 109. The delay circuit 107 is coupled to the power detector module 101 for receiving the first reset signal $S_1$, and delaying the first reset signal $S_1$ for the threshold time to output a delayed reset signal $S_1'$. The logic circuit 109 is coupled to the power detector module 101 and the delay circuit 107. The logic circuit 109 receives the first reset signal $S_1$ of the power detector module 101 and the delayed reset signal $S_1'$ of the delay circuit 107 for processing a logical AND operation, and correspondingly outputs the second reset signal $S_2$. While both the first reset signal $S_1$ and the delayed reset signal $S_1'$ are asserted, the asserted second reset signal $S_2$ is generated to bring a system reset.

Figure 2:
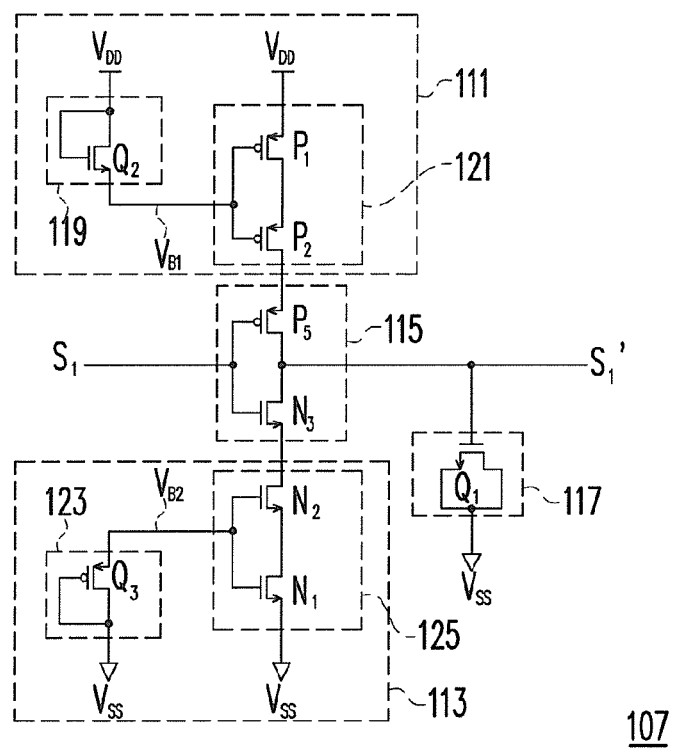
FIG. 2 is a circuit diagram of a delay circuit according to an embodiment of the present invention.

In the embodiment, the delay circuit 107 is implemented by a RC circuit, but the present invention is not limited thereto. In accordance with the capacitance of the capacitor and the resistance of the resistor in the RC circuit, the charging time or the discharging time of the capacitor could be determined. In other words, the threshold time is the charging time or the discharging time of the RC circuit. FIG. 2 is a circuit diagram of the delay circuit 107 according to an embodiment of the present invention. Referring to FIG. 2, the delay circuit 107 includes a first resistor module 111, a second resistor module 113, a switch module 115, and a capacitor module 117. The first resistor module 111 provides a first resistance, and the first terminal of the first resistor module 111 is coupled to the first voltage $V_{DD}$. The second resistor module 113 provides a second resistance, and the first terminal of the second resistor module 113 is coupled to the second voltage $V_{SS}$.

The first resistor module 111 includes a first bias circuit 119 and a first transistor module 121. The first bias circuit 119 includes an n-channel transistor $Q_2$. The transistor $Q_2$ has a gate coupled to the first voltage $V_{DD}$, a drain coupled to the first voltage $V_{DD}$, and a source. The first transistor module 121 has a control terminal, a first terminal coupled to the first voltage $V_{DD}$, and a second terminal coupled to the second terminal of the switch module 115. The first transistor module 121 includes a first p-channel transistor $P_1$ and a second p-channel transistor $P_2$. The transistor $P_1$ has a gate being the control terminal of the first transistor module 121, a source being the first terminal of the first transistor module 121, and a drain. The transistor $P_2$ has a gate coupled to the gate of the transistor $P_1$, a source coupled to the drain of the transistor $P_1$, and a drain being the second terminal of the first transistor module 121. The first voltage $V_{DD}$ conducts the transistor $Q_2$, and the transistor $Q_2$ provides a first bias voltage $V_{B1}$ via the source thereof. The first bias voltage $V_{B1}$ is outputted to the control terminal of the first transistor module 121. The transistor $P_1$ and the transistor $P_2$ are biased by the first bias voltage $V_{B1}$ and operate like the resistors to provide the first resistance. In other words, the transistor $P_1$ and the transistor $P_2$ are hereby voltage-controlled resistors.

The first resistor module 113 includes a second bias circuit 123 and a second transistor module 125. The second bias circuit 123 includes p-channel transistor $Q_3$. The transistor $Q_3$ has a gate coupled to the second voltage $V_{SS}$, a drain coupled to the second voltage $V_{SS}$, and a source. The second transistor module 125 has a control terminal, a first terminal coupled to the second voltage $V_{SS}$, and a second terminal coupled to the third terminal of the switch module 115. The second transistor module 125 includes a first n-channel transistor $N_1$ and a second n-channel transistor $N_2$. The transistor $N_1$ has a gate being the control terminal of the second transistor module 125, a drain, and a source being the first terminal of the second transistor module 125. The transistor $N_2$ has a gate coupled to the gate of the transistor $N_1$, a drain being the second terminal of the second transistor module 125, and a source coupled to the drain of the transistor $N_1$. The second voltage $V_{SS}$ conducts the transistor $Q_3$, and the transistor $Q_3$ provides a second bias voltage $V_{B2}$ via the source thereof. The second bias voltage $V_{B2}$ is outputted to the control terminal of the second transistor module 125. The transistor $N_1$ and the transistor $N_2$ are biased by the second bias voltage $V_{B2}$ and operate like the resistors to provide the second resistance. In other words, the transistor $N_1$ and the transistor $N_2$ are hereby voltage-controlled resistors.

The switch module 115 includes a control terminal coupled to the power detector module 101, a second terminal coupled to a second terminal of the first resistor module 111, a third terminal coupled to a second terminal of the second resistor module 113, and a first terminal. In the embodiment, the switch module 115 includes a fifth p-channel transistor $P_5$ and a third n-channel transistor $N_3$. The transistor $P_5$ has a gate being the control terminal of the switch module 115, a source being the second terminal of the switch module 115, and a drain being the first terminal of the switch module 115. The transistor $N_3$ has a gate coupled to the gate of the transistor $P_5$, a source being the third terminal of the switch module 115, and a drain coupled to the drain of the transistor $P_5$. The capacitor module 117 is coupled between the first terminal of the switch module 115 and the second voltage $V_{SS}$. The control terminal of the switch module 115 receives the first reset signal $S_1$ from the power detector module 101. When the first reset signal $S_1$ is deasserted, the transistor P5 is turned on to form a charging path, and the capacitor module 117 is charged. When the first reset signal $S_1$ is asserted, the transistor $N_3$ is turned on to form a discharging path, and the capacitor module 117 is discharged. Therefore, the first reset signal $S_1$ is delayed for the threshold time, and the delayed reset signal $S_1'$ is outputted by the delay circuit 107.

The capacitor module 117 may be implemented by an n-channel transistor $Q_1$. The transistor $Q_1$ is hereby equivalent to a capacitor. The transistor $Q_1$ has a gate being the first terminal of the capacitor module 117, a source being the second terminal of the capacitor module 117, and a drain coupled to the source thereof. The gate of the transistor $Q_1$ is coupled to the first terminal of the switch module 115, and the source of the transistor $Q_1$ is coupled to the second voltage $V_{SS}$. Besides, the embodiment respectively employs the PMOS transistors and NMOS transistors for the p-channel transistors and the n-channel transistors, but the present invention is not limited thereto. People skilled in the art may employ the transistors which substantially having the equivalent functions, e.g. IGBT (Insulated Gate Bipolar Transistor) or BJT (Bipolar Junction Transistor).

The logic circuit 109 includes an AND gate 151. The AND gate 151 has a first input terminal coupled to the delay circuit 107 for receiving the delayed reset signal $S_1'$, a second input terminal coupled to the power detector module 101 for receiving the first reset signal $S_1$, and an output terminal outputting the second reset signal $S_2$. But while the first reset signal $S_1$ is asserted/deasserted, the delayed reset signal $S_1'$ is deasserted/asserted due to the discharging/charging of the capacitor module 117. In other words, the delayed reset signal $S_1'$ has a reverse logic level relative to the first reset signal $S_1$. Therefore, in the embodiment, the first input terminal of the AND gate 151 should be an inverting input terminal for inverting the logic level of the delayed reset signal $S_1'$.

Figure 3:
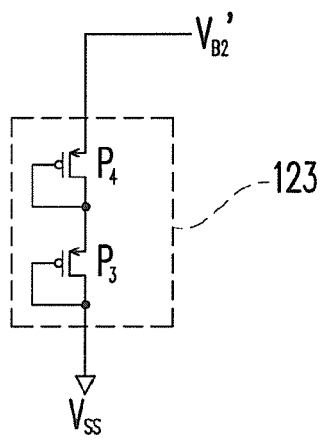
FIG. 3 is a circuit diagram of a second bias circuit in FIG. 2.

The threshold voltage of the NMOS transistor is greater than the PMOS transistor due to the body effect. Therefore, the second resistance is greater than the first resistance, and the discharging of the capacitor module 117 is slower than the charging of the capacitor module 117. FIG. 3 is a circuit diagram of the second bias circuit 123 in FIG. 2. Referring to FIG. 3, in the embodiment, the second bias circuit 123 includes a third p-channel transistor $P_3$ and a fourth p-channel transistor $P_4$. The transistor $P_3$ has a gate coupled to the second voltage $V_{SS}$, a drain coupled to the second voltage $V_{SS}$, and a source. The transistor $P_4$ has a gate coupled to the source of the transistor $P_3$, a drain coupled to the source of the transistor $P_3$, and a source coupled to the control terminal of the second transistor module 125. For example, the bias voltage $V_{B2}'$ provided by the transistor $P_3$ and the transistor $P_4$ is two times the magnitude of the second bias voltage $V_{B2}$. Thus the second resistance is decreased so as to speed the discharging time of the capacitor module 117.

Besides, while the first reset signal S1 is deasserted, the capacitor module 117 may be charged. If the pulse-width of the first reset signal S1 is smaller than the threshold time, the charging of the capacitor module 117 could not be finished, and therefore the first reset signal S1 may be treated as a noise and filtered by the capacitor module 117. While the first reset signal S1 is asserted, the capacitor module 117 may be discharged. If the pulse-width of the first reset signal S1 is smaller than the threshold time, the discharging of the capacitor module 117 could not be finished, and therefore the first reset signal S1 may be treated as a noise and filtered by the capacitor module 117.

Figure 4:
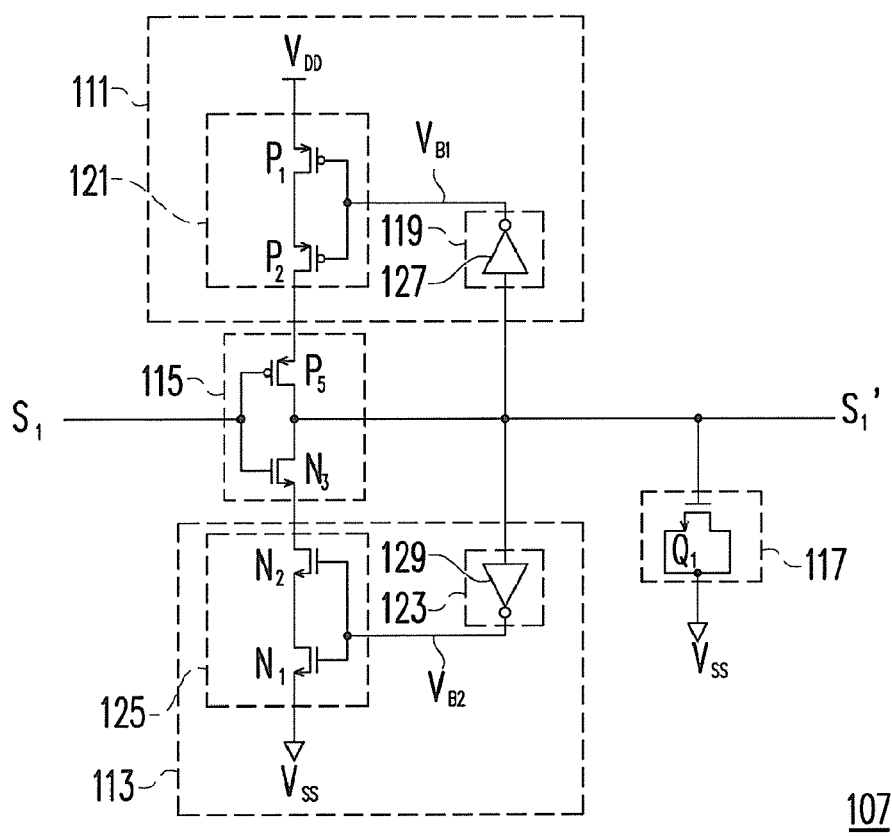
FIG. 4 is a circuit diagram of a delay circuit according to an embodiment of the present invention.

FIG. 4 is a circuit diagram of the delay circuit 107 according to an embodiment of the present invention. Referring to FIGS. 2 and 4, the differences between the embodiments in FIGS. 2 and 4 are the first bias circuit 119 and the second bias circuit 123. In the embodiment, referring to FIG. 4, the first bias circuit 119 includes a NOT gate 127. The NOT gate 127 has an input terminal coupled to the first terminal of the switch module 115, and an output terminal coupled to the control terminal of the first transistor module 121. While the first reset signal $S_1$ is deasserted, the transistor $P_5$ is turned on and a leakage current from the first transistor module 121 charges the capacitor module 117. In the meanwhile, when the voltage of the capacitor module 117 is greater than the threshold voltage of the NOT gate 127, the NOT gate 127 outputs a low voltage, i.e. the first bias voltage $V_{B1}$, to conduct the first transistor module 121. The charging of the capacitor module 117 is finished, and therefore the delayed reset signal SF is outputted from the delay circuit 107.

The second bias circuit 123 includes a NOT gate 129. The NOT gate 129 has an input terminal coupled to the first terminal of the switch module 115, and an output terminal coupled to the control terminal of the second transistor module 125. While the first reset signal $S_1$ is asserted, the transistor $N_3$ is turned on, and the capacitor module 117 discharges due to a leakage current flowing through the second transistor module 125 to the second voltage $V_{SS}$. In the meanwhile, when the voltage of the capacitor module 117 is lower than the threshold voltage of the NOT gate 129, the NOT gate 129 outputs a high voltage, i.e. the first bias voltage $V_{B2}$, to conduct the second transistor module 125, and the discharging of the capacitor module 117 is finished.

Figure 5:
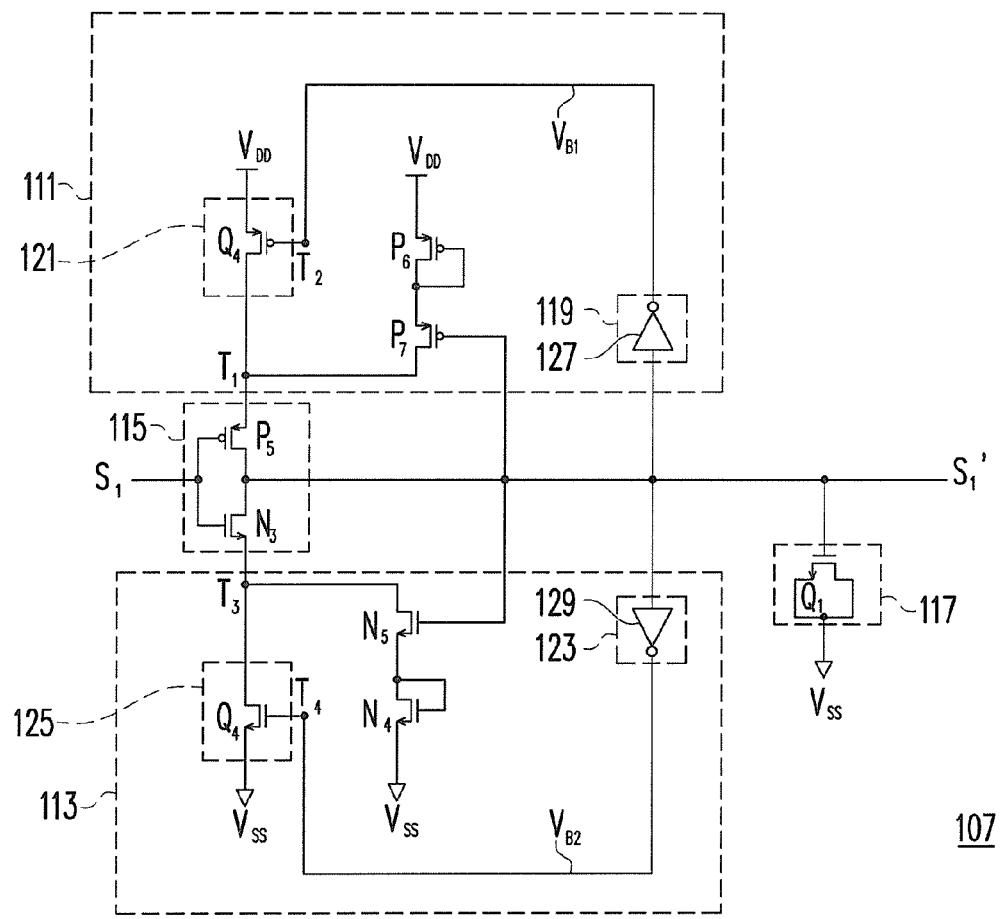
FIG. 5 is a circuit diagram of a delay circuit according to an embodiment of the present invention.
Figure 6:
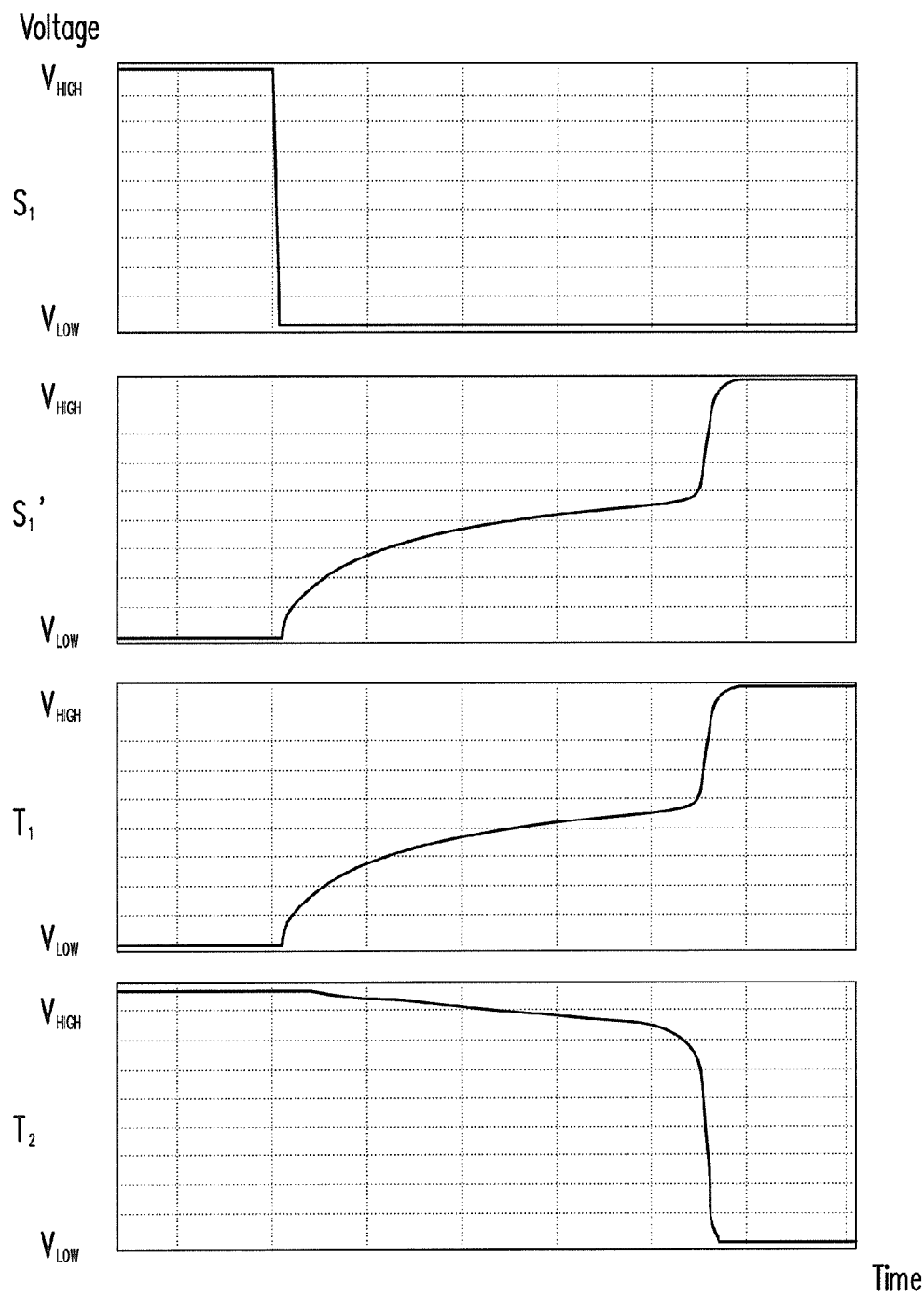
FIG. 6 is a timing diagram of a first resistor module in FIG. 5.

FIG. 5 is a circuit diagram of the delay circuit 107 according to an embodiment of the present invention. Referring to FIG. 5, the first resistor module 111 includes the first bias circuit 119, the first transistor module 121, a sixth p-channel transistor $P_6$, and a seventh p-channel transistor $P_7$. The transistor $P_6$ has a source coupled to the first voltage $V_{DD}$, a gate, and a drain. The transistor $P_7$ has a source coupled to the gate and the drain of the transistor $P_6$, a gate coupled to the first terminal of the switch module 115, and a drain coupled to the second terminal of the switch module 115. The first transistor module 121 includes a p-channel transistor $Q_4$. The transistor $Q_4$ has a source being the first terminal of the first transistor module 121, a gate being the control terminal of the first transistor module 121, and a drain being the second terminal of the first transistor module 121, wherein the drain of the transistor $Q_4$ is coupled to the source of the transistor $P_5$ via the terminal $T_1$, and the gate of the transistor $Q_4$ is coupled to the output terminal of the NOT gate 127 via the terminal $T_2$. FIG. 6 is a timing diagram of the first resistor module 111 in FIG. 5. Referring to FIGS. 5 and 6, when the first reset signal $S_1$ is changed from asserted to deasserted, the transistors $P_6$ and $P_7$ are turned on to provide a current flowing to the first terminal of the switch module 115, and the capacitor module 117 is charged by the current. Then the voltage of the capacitor module 117 increases gradually, and the voltage at the terminal $T_1$ and the voltage of the delayed reset signal $S_1'$ also increase. In the meanwhile, the current from the transistors $P_6$ and $P_7$ decreases correspondingly due to the increasing voltage of the capacitor module 117. After the voltage of the capacitor module 117 is greater than the threshold voltage of the NOT gate 127, the NOT gate 127 outputs a low voltage. In other words, the voltage of the terminal $T_2$ is pulled down to $V_{LOW}$. At this point, the transistor $Q_4$ is turned on, and then the voltage of the capacitor module 117 is pulled up to $V_{HIGH}$ to finish the charging.

The second resistor module 113 includes the second bias circuit 123, the second transistor module 125, a fourth n-channel transistor $N_4$, and a fifth n-channel transistor $N_5$. The transistor $N_4$ has a source coupled to the second voltage $V_{SS}$, a gate, and a drain. The transistor $N_5$ has a source coupled to the gate and the drain of the transistor $N_4$, a gate coupled to the first terminal of the switch module 115, and a drain coupled to the third terminal of the switch module 115. The second transistor module 125 includes an n-channel transistor $Q_5$. The transistor $Q_5$ has a source being the first terminal of the second transistor module 125, a gate being the control terminal of the second transistor module 125, and a drain being the second terminal of the second transistor module 125, wherein the drain of the transistor $Q_5$ is coupled to the source of the transistor $N_3$ via the terminal $T_3$, and the gate of the transistor $Q_5$ is coupled to the output terminal of the NOT gate 129 via the terminal $T_4$. When the first reset signal $S_1$ is changed from deasserted to asserted, the transistors $N_4$ and $N_5$ are turned on, and the capacitor module 117 discharges to provide a current flowing to the second voltage $V_{SS}$ via the transistors $N_4$ and $N_5$. Then the voltage of the capacitor module 117 decreases gradually, and the voltage at the terminal $T_3$ and the voltage of the delayed reset signal $S_1'$ also decrease. In the meanwhile, the current through the transistors $N_4$ and $N_5$ decreases correspondingly due to the decreasing voltage of the capacitor module 117. After the voltage of the capacitor module 117 is lower than the threshold voltage of the NOT gate 129, the NOT gate 129 outputs a high voltage. In other words, the voltage of the terminal $T_4$ is pulled up to $V_{HIGH}$. At this point, the transistor $Q_5$ is turned on, and then the voltage of the capacitor module 117 is pulled down to $V_{LOW}$ to finish the discharging.

Figure 7:
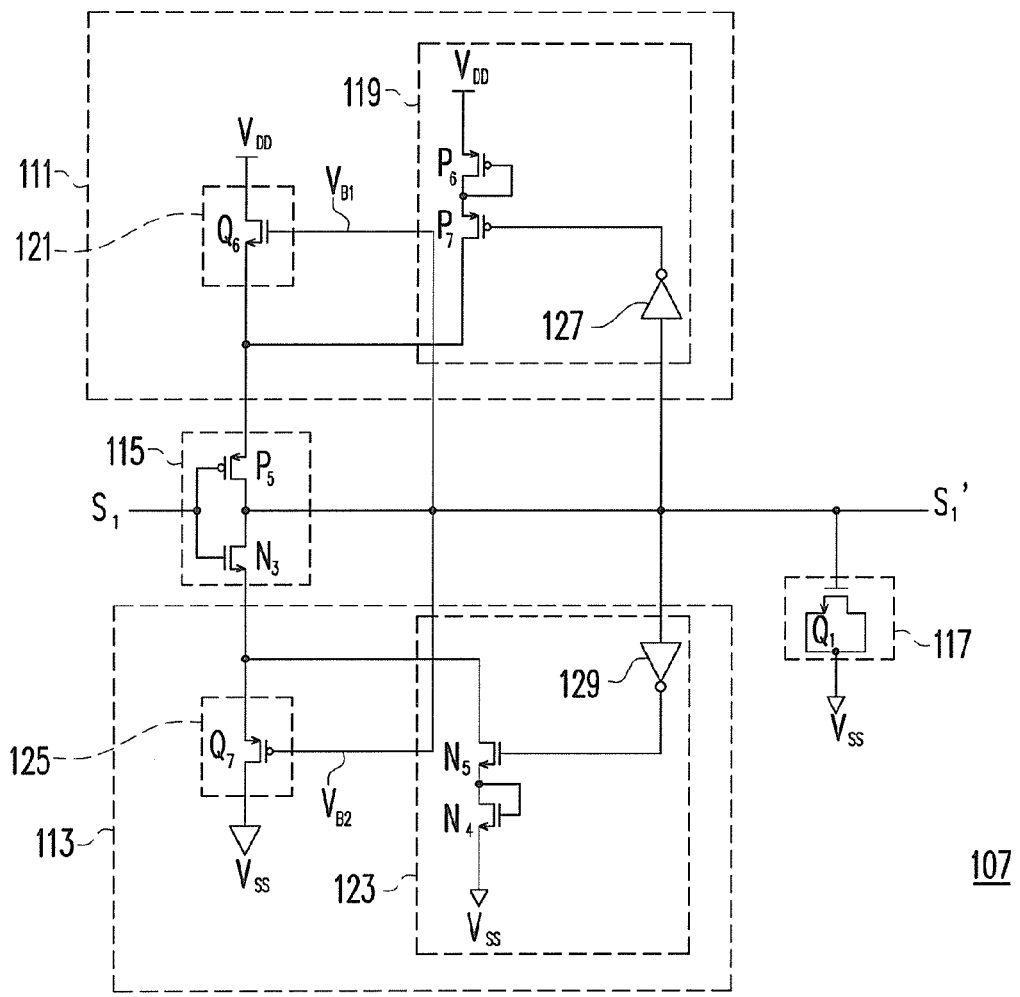
FIGS. 7 through 9 are circuit diagrams of a delay circuit according to an embodiment of the present invention.
Figure 8:
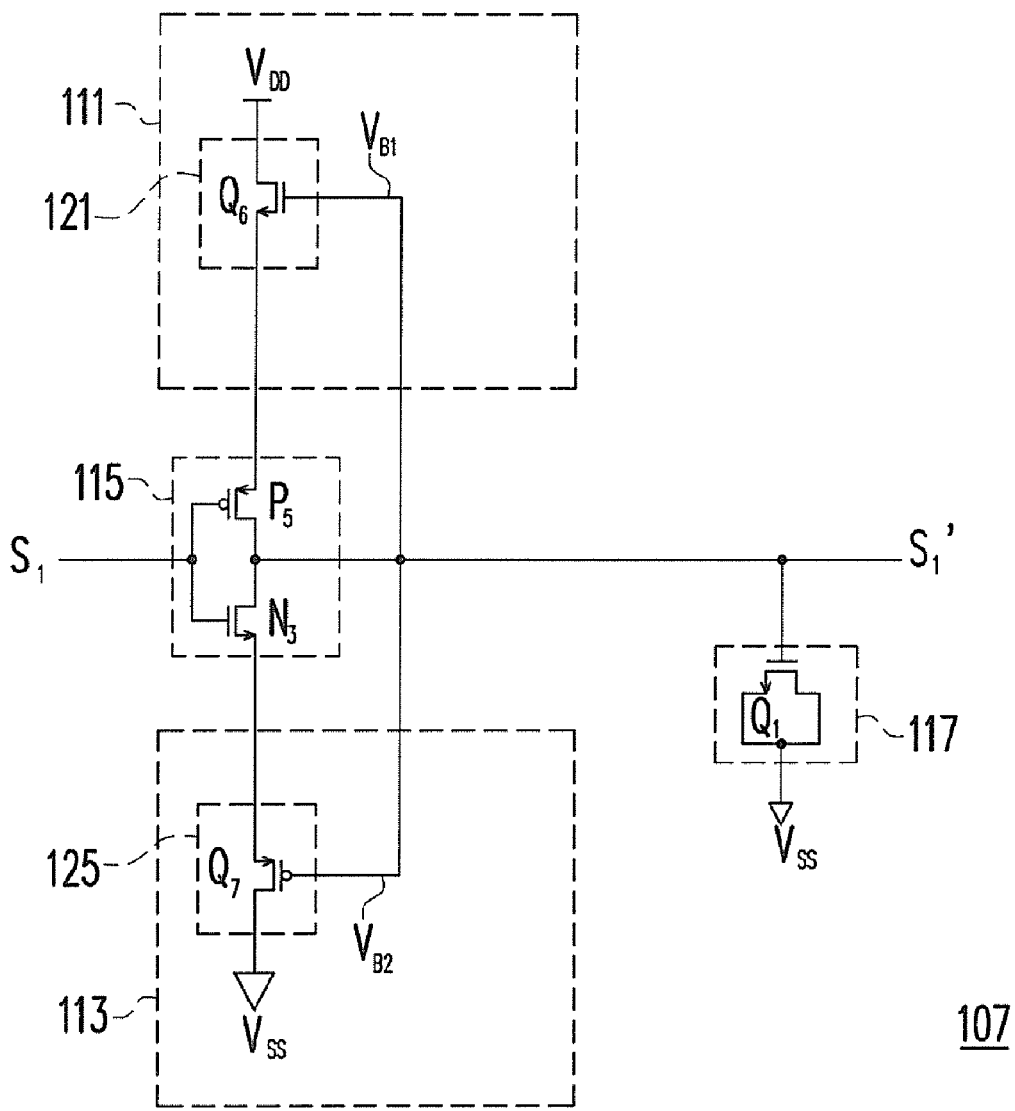
Figure 9:
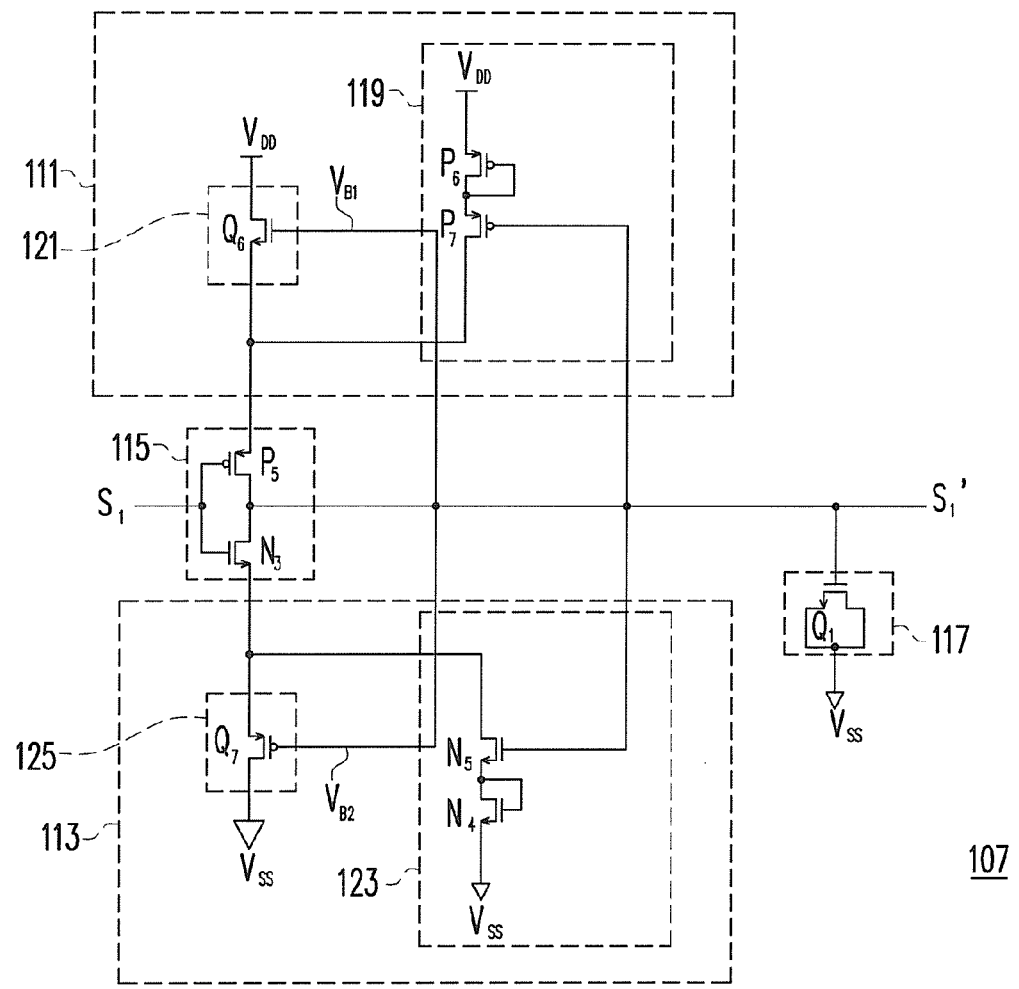

According to the above-mentioned description of the delay circuit 107, FIGS. 7 through 9 show exemplary circuit diagrams of the delay circuit 107 according to an embodiment of the present invention. Referring to FIG. 7, the first transistor module 121 includes an n-channel transistor $Q_6$. The transistor $Q_6$ has a gate coupled to the first terminal of the switch module 115, a drain coupled to the first voltage $V_{DD}$, and a source coupled to the second terminal of the switch module 115. The first bias circuit 119 includes the transistor $P_6$, the transistor $P_7$, and the NOT gate 127, wherein the output terminal of the NOT gate 127 is coupled to the gate of the transistor $P_7$. When the first reset signal $S_1$ is changed from asserted to deasserted, a leakage current from the transistor $Q_6$ flows into the capacitor module 117. With gradually charging of the capacitor module 117, the capacitor module 117 provides the first bias voltage $V_{B1}$ to conduct the transistor $Q_6$. After the voltage of the capacitor module 117 is greater than the threshold voltage of the NOT gate 127, the NOT gate 127 outputs a low voltage to conduct the transistor $P_7$. Therefore, a current flows through the transistors $P_6$ and $P_7$ to charge of the capacitor module 117.

The second transistor module 125 includes a p-channel transistor $Q_7$. The transistor $Q_7$ has a gate coupled to the first terminal of the switch module 115, a drain coupled to the second voltage $V_{SS}$, and a source coupled to the third terminal of the switch module 115. The second bias circuit 123 includes the transistor $N_4$, the transistor $N_5$, and the NOT gate 129, wherein the output terminal of the NOT gate 129 is coupled to the gate of the transistor $N_5$. When the first reset signal $S_1$ is changed from deasserted to asserted, the capacitor module 117 discharges, and a leakage current flows through the transistor $Q_7$. With gradually discharging of the capacitor module 117, the capacitor module 117 provides the second bias voltage $V_{B2}$ to conduct the transistor $Q_7$. After the voltage of the capacitor module 117 is lower than the threshold voltage of the NOT gate 129, the NOT gate 129 outputs a high voltage to conduct the transistor $N_5$. The transistors $N_4$ and $N_5$ form a discharging path, and therefore the discharging of the capacitor module 117 is finished.

Referring to FIG. 8, the first resistor module 111 includes the first transistor module 121. The first transistor module 121 includes the transistor $Q_6$, wherein the gate of the transistor $Q_6$ is coupled to the first terminal of the switch module 115. When the first reset signal $S_1$ is deasserted, a leakage current flows through the transistor $Q_6$ to charge the capacitor module 117. The gradually increasing voltage of the capacitor module 117 is hereby treated as the first bias voltage $V_{B1}$ to conduct the transistor $Q_6$, and then the charging of the capacitor module 117 is finished. The second resistor module 113 includes the second transistor module 125. The second transistor module 125 includes the transistor $Q_7$, wherein the gate of the transistor $Q_7$ is coupled to the first terminal of the switch module 115. When the first reset signal $S_1$ is asserted, the capacitor module 117 discharges, and a leakage current flows through the transistor $Q_7$. The gradually decreasing voltage of the capacitor module 117 is hereby treated as the second bias voltage $V_{B2}$ to conduct the transistor $Q_7$, and then the discharging of the capacitor module 117 is finished.

Referring to FIG. 9, the first bias circuit 119 includes the transistor $P_6$, and the transistor $P_7$. The gate of the transistor $Q_6$ is coupled to the first terminal of the switch module 115. When the first reset signal $S_1$ is changed from asserted to deasserted, the transistor $P_7$ is conducted due to the low voltage of the capacitor module 117, and a current flows through the transistors $P_6$ and $P_7$ to charge the capacitor module 117. The gradually increasing voltage of the capacitor module 117 is hereby treated as the first bias voltage $V_{B1}$ to conduct the transistor $Q_6$, and then the charging of the capacitor module 117 is finished.

The second bias circuit 123 includes the transistor $N_4$, and the transistor $N_5$. The gate of the transistor $Q_7$ is coupled to the first terminal of the switch module 115. When the first reset signal $S_1$ is changed from deasserted to asserted, the transistor $N_5$ is conducted due to the high voltage of the capacitor module 117, and a current flows through the transistors $N_4$ and $N_5$ due to discharging of the capacitor module 117. The gradually decreasing voltage of the capacitor module 117 is hereby treated as the second bias voltage $V_{B2}$ to conduct the transistor $Q_7$, and then the discharging of the capacitor module 117 is finished.

Figure 10:
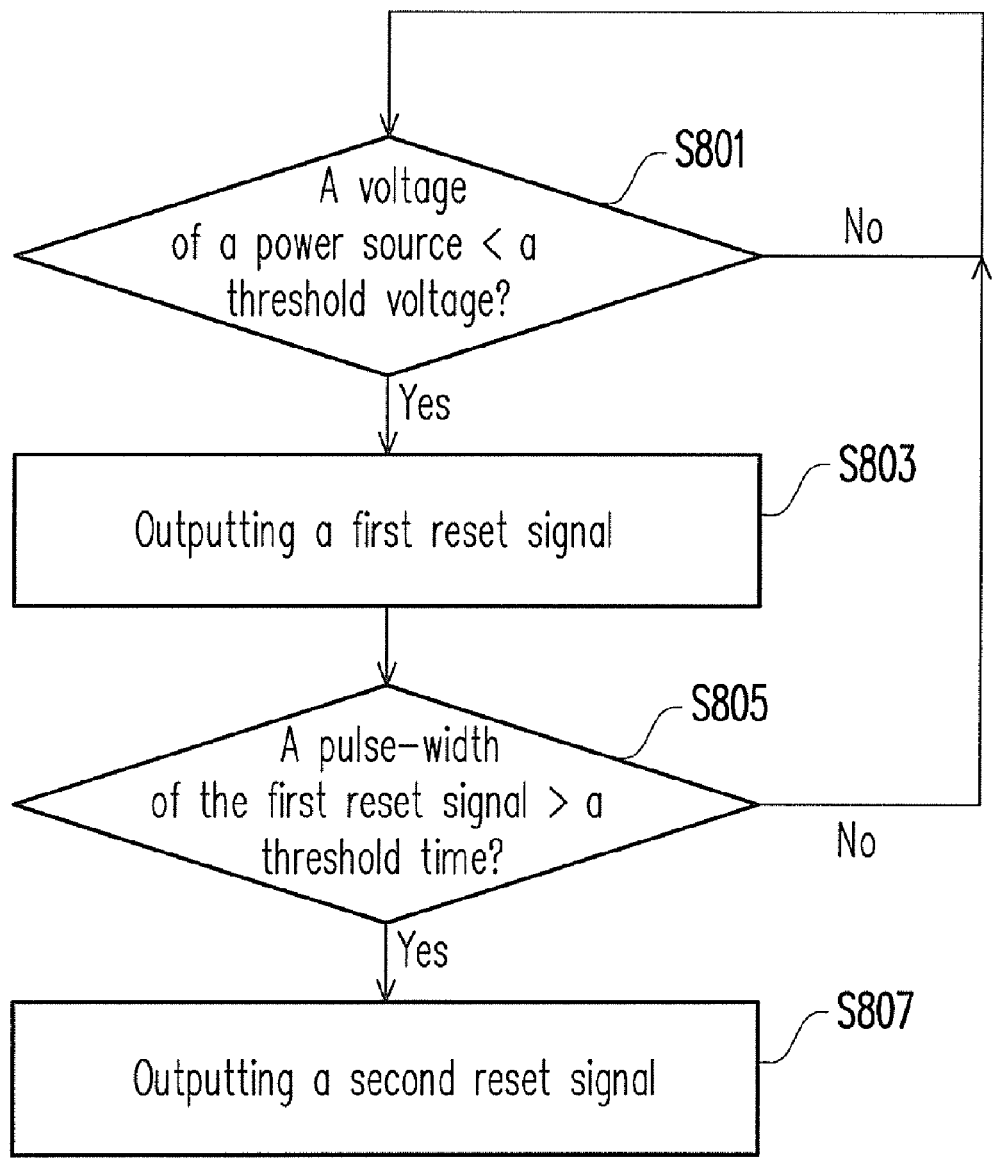
FIG. 10 is a flowchart of a reset method according to an embodiment of the present invention.

FIG. 10 is a flowchart of a reset method according to an embodiment of the present invention. Referring to FIG. 10, the reset method is introduced as follows. In step S801, it is detected whether a voltage of a power source is lower than a threshold voltage. While the voltage of the power source is lower than the threshold voltage, step S803 is performed; otherwise the step S801 is repeated. In step S803, a first reset signal is outputted. Then step S805 is performed to determine whether a pulse-width of the first reset signal is greater than a threshold time. While the pulse-width of the first reset signal is greater than the threshold time, step S807 is performed to output a second reset signal; otherwise the step S801 is repeated.

Figure 11:
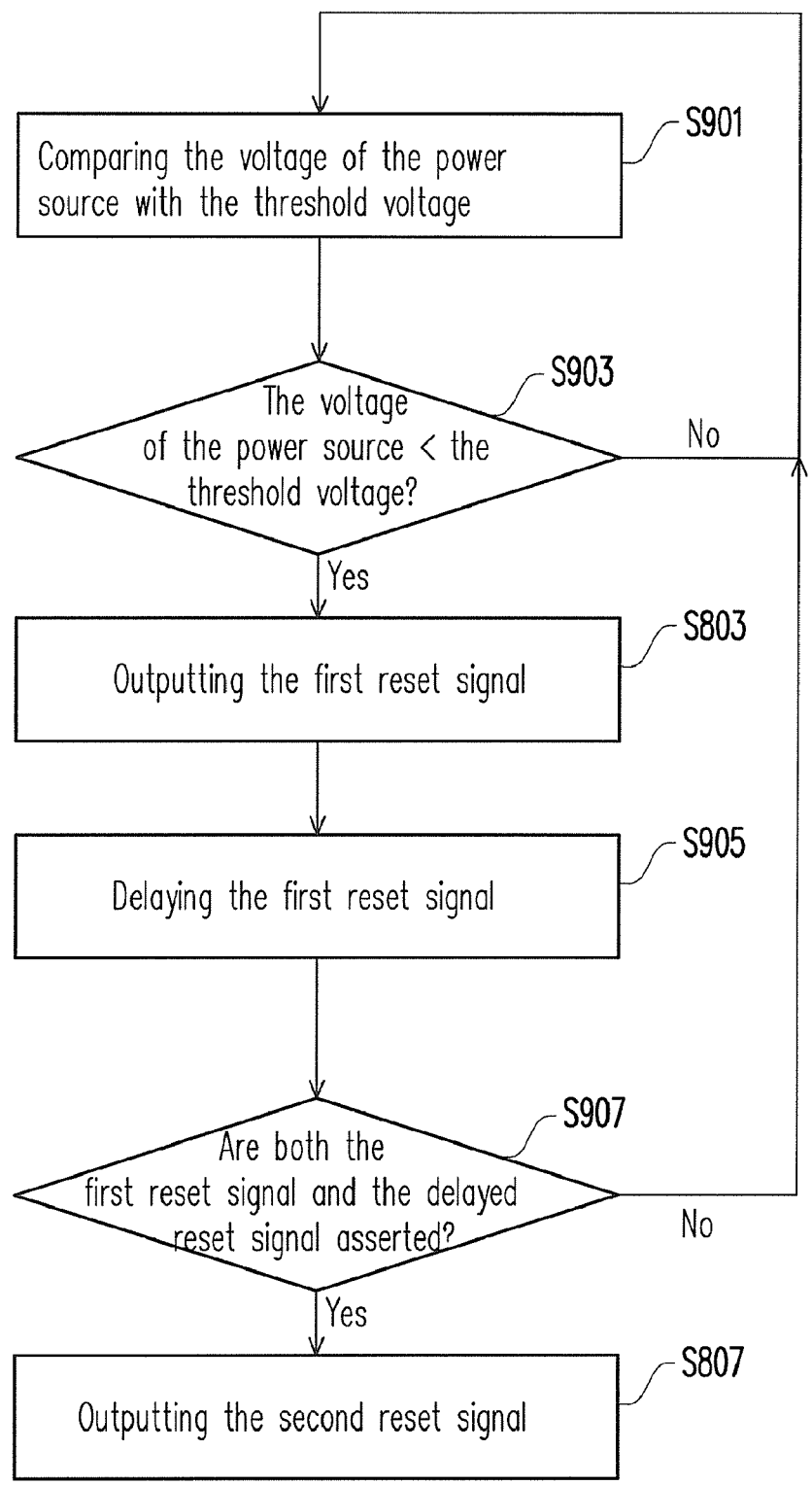
FIG. 11 is a flowchart of a reset method according to an embodiment of the present invention.

FIG. 11 is a flowchart of a reset method according to an embodiment of the present invention. Referring to FIG. 11, in step S901, a voltage comparator is provided to compare the voltage of the power source with the threshold voltage. In step S903, it is determined whether the voltage of the power source is lower than a threshold voltage according to the comparing result. In other words, while the voltage of the power source is lower than the threshold voltage, step S803 is performed; otherwise step S901 is repeated. In the step S803, the voltage comparator outputs the first reset signal. The step S905 is performed to delay the first reset signal for the threshold time and provide a delayed reset signal. The first reset signal would be treated as a noise and filtered due to the pulse-width thereof smaller than the threshold time. Step S907 is performed to process a logical AND operation with the first reset signal and the delayed reset signal. While both the first reset signal and the delayed reset signal are asserted, step 807 is performed; otherwise step S901 is repeated. The step S807 is performed to output the second reset signal provided in accordance with an operating result of the logical AND operation.

In summary, the power detector module 101 detects whether the voltage is lower than the threshold voltage $V_{TH}$. While the voltage is lower than the threshold voltage $V_{TH}$, the power detector module 101 outputs the first reset signal $S_1$ correspondingly. The first bias circuit 119 provides the first bias voltage $V_{B1}$ to bias the first transistor module 121 for providing the first resistance. The second bias circuit 123 provides the second bias voltage $V_{B2}$ to bias the second transistor module 125 for providing the second resistance. The switch module 115 selectively connects the capacitor module 117 with the first resistor module 111 or the second resistor module 113 in accordance with the first reset signal $S_1$, and the capacitor module 117 is charged or discharged correspondingly for outputting the delayed reset signal $S_1'$. While the pulse-width of the first reset signal $S_1$ is smaller than the threshold time, the first reset signal $S_1$ may be treated as a noise and filtered by the capacitor module 117. The logic circuit 109 processes the logical AND operation with the first reset signal $S_1$ and the delayed reset signal $S_1'$, and the logical AND operation provides the second reset signal $S_2$.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A reset circuit, comprising:
    a power detector module, detecting whether a voltage of a power source being lower than a threshold voltage, and correspondingly outputting a first reset signal; and
    a pulse-width determination module, coupled to the power detector module, determining whether a pulse-width of the first reset signal being long enough, and correspondingly outputting a second reset signal to reset a system, the pulse-width determination module comprising:
    a delay circuit delaying the first reset signal for the threshold time to output a delayed reset signal, the delay circuit comprising:
    a first resistor module, providing a first resistance, wherein a first terminal of the first resistor module is coupled to a first voltage, the first resistor module comprising:
    a first bias circuit, providing a first bias voltage; and
    a first transistor module, having a control terminal receiving the first bias voltage, a first terminal coupled to the first voltage, and a second terminal coupled to the second terminal of the switch module;
    a second resistor module, providing a second resistance, wherein a first terminal of the second resistor module is coupled to a second voltage, the second resistor module comprising:
    a second bias circuit, providing a second bias voltage;
    a switch module, having a control terminal coupled to the power detector module, a first terminal coupled to the logic circuit, a second terminal coupled to a second terminal of the first resistor module, and a third terminal coupled to a second terminal of the second resistor module, wherein the first terminal selectively connected to the second terminal or the third terminal thereof in accordance with the control terminal thereof; and
    a capacitor module, coupled between the first terminal of the switch module and the second voltage,
    wherein the first bias circuit comprises a NOT gate having an input terminal coupled to the first terminal of the switch module, and an output terminal providing the first bias voltage to the control terminal of the first transistor module; and
    a logic circuit, coupled to the delay circuit and the power detector module, and processing a logical AND operation with the first reset signal and the delayed reset signal for outputting the second reset signal.

2. The reset circuit as claimed in claim 1, wherein the power detector module comprises:
    a voltage comparator, comparing the voltage of the power source with the threshold voltage, and correspondingly outputting the first reset signal in accordance with a comparing result.

3. The reset circuit as claimed in claim 1, wherein the logic circuit comprises an AND gate having a first input terminal coupled to the delay circuit, a second input terminal coupled to the power detector module, and an output terminal outputting the second reset signal.

4. A delay circuit, comprising:
    a first resistor module, providing a first resistance, wherein a first terminal of the first resistor module is coupled to a first voltage, the first resistor module comprising:
    a first bias circuit, providing a first bias voltage; and
    a first transistor module, having a control terminal receiving the first bias voltage, a first terminal coupled to the first voltage, and a second terminal coupled to the second terminal of the switch module;
    a second resistor module, providing a second resistance, wherein a first terminal of the second resistor module is coupled to a second voltage, the second resistor module comprising:
    a second bias circuit, providing a second bias voltage;
    a switch module, having a control terminal served as a input terminal of the delay circuit, a first terminal served as a output terminal of the delay circuit, a second terminal coupled to a second terminal of the first resistor module, and a third terminal coupled to a second terminal of the second resistor module, wherein the first terminal selectively connected to the second terminal or the third terminal thereof in accordance with the control terminal thereof; and
    a capacitor module, coupled between the first terminal of the switch module and the second voltage,
    wherein the first bias circuit comprises a NOT gate having an input terminal coupled to the first terminal of the switch module, and an output terminal providing the first bias voltage to the control terminal of the first transistor module.

5. The delay circuit as claimed in claim 4, wherein the first resistor module comprises:
    a first transistor module, having a control terminal coupled to the first terminal of the switch module, a first terminal coupled to the first voltage, and a second terminal coupled to the second terminal of the switch module.

6. The delay circuit as claimed in claim 4, wherein the second resistor module comprises:
    a second transistor module, having a control terminal coupled to the first terminal of the switch module, a first terminal coupled to the second voltage, and a second terminal coupled to the third terminal of the switch module.

7. The delay circuit as claimed in claim 4, wherein the first bias circuit comprises a n-channel transistor having a gate coupled to the first voltage, a drain coupled to the first voltage, and a source providing the first bias voltage to the control terminal of the first transistor module.

8. The delay circuit as claimed in claim 4, wherein the first transistor module comprises:
   a first p-channel transistor, having a gate being the control terminal of the first transistor module, a source being the first terminal of the first transistor module, and a drain; and
   a second p-channel transistor, having a gate coupled to the gate of the first p-channel transistor, a source coupled to the drain of the first p-channel transistor, and a drain being the second terminal of the first transistor module.

9. The delay circuit as claimed in claim 4, wherein the second resistor module further comprises:
   a second transistor module, having a control terminal receiving the second bias voltage, a first terminal coupled to the second voltage, and a second terminal coupled to the third terminal of the switch module.

10. The delay circuit as claimed in claim 9, wherein the second bias circuit comprises a p-channel transistor having a gate coupled to the second voltage, a drain coupled to the second voltage, and a source outputting the second bias voltage to the control terminal of the second transistor module.

11. The delay circuit as claimed in claim 9, wherein the second bias circuit comprises:
   a third p-channel transistor, having a gate coupled to the second voltage, a drain coupled to the second voltage, and a source; and
   a fourth p-channel transistor, having a gate coupled to the source of the third p-channel transistor, a drain coupled to the source of the third p-channel transistor, and a source providing the second bias voltage to the control terminal of the second transistor module.

12. The delay circuit as claimed in claim 9, wherein the second bias circuit comprises a NOT gate having an input terminal coupled to the first terminal of the switch module, and an output terminal providing the second bias voltage to the control terminal of the second transistor module.

13. The delay circuit as claimed in claim 9, wherein the second transistor module comprises:
   a first n-channel transistor, having a gate being the control terminal of the second transistor module, a drain, and a source being the first terminal of the second transistor module; and
   a second n-channel transistor, having a gate coupled to the gate of the first n-channel transistor, a drain being the second terminal of the second transistor module, and a source coupled to the drain of the first n-channel transistor.

14. The delay circuit as claimed in claim 4, wherein the switch module comprises:
   a fifth p-channel transistor, having a gate being the control terminal of the switch module, a source being the second terminal of the switch module, and a drain being the first terminal of the switch module; and
   a third n-channel transistor, having a gate coupled to the gate of the fifth p-channel transistor, a source being the third terminal of the switch module, and a drain coupled to the drain of the fifth p-channel transistor.

15. The delay circuit as claimed in claim 4, further comprises:
   a sixth p-channel transistor, having a source coupled to the first voltage, a gate, and a drain; and
   a seventh p-channel transistor, having a source coupled to the gate and the drain of the sixth p-channel transistor, a gate coupled to the first terminal of the switch module, and a drain coupled to the second terminal of the switch module.

16. The delay circuit as claimed in claim 4, further comprises:
   a fourth n-channel transistor, having a source coupled to the second voltage, a gate, and a drain; and
   a fifth n-channel transistor, having a source coupled to the gate and the drain of the fourth n-channel transistor, a gate coupled to the first terminal of the switch module, and a drain coupled to the third terminal of the switch module.

* * * * *